(12) United States Patent
Chih-Hung et al.

(10) Patent No.: US 6,681,271 B2
(45) Date of Patent: Jan. 20, 2004

(54) COMPUTER SYSTEM FOR MULTI-TYPE DRAM SUPPORT

(75) Inventors: Tsai Chih-Hung, Taipei Hsien (TW); Li-Te Cheng, Taipei Hsien (TW); Wu Shun-Cheng, Taipei Hsien (TW); Kun-Feng Cheng, Taipei Hsien (TW); An-Chung Chen, Taipei Hsien (TW); Horng-Sheng Chen, Taipei Hsien (TW)

(73) Assignee: Acer Laboratories, Inc., Taipei Hsien (TW)

( * ) Notice: Subject to any disclaimer, the term of this patent is extended or adjusted under 35 U.S.C. 154(b) by 345 days.

(21) Appl. No.: 09/931,946

(22) Filed: Aug. 20, 2001

(65) Prior Publication Data

US 2002/0018354 A1 Feb. 14, 2002

(30) Foreign Application Priority Data

Aug. 12, 2000 (TW) ........................................ 89126153 A

(51) Int. Cl.⁷ ................................................. G06F 5/00
(52) U.S. Cl. ............................ 710/43; 710/17; 711/4; 711/105
(58) Field of Search ............................ 710/1, 3, 13, 17, 710/33, 36, 38, 41–43, 74, 107; 712/225, 232; 711/4, 100, 105

(56) References Cited

U.S. PATENT DOCUMENTS

| | | | | |
|---|---|---|---|---|
| 5,064,378 A | * | 11/1991 | Olson et al. | 439/68 |
| 5,590,071 A | * | 12/1996 | Kolor et al. | 365/149 |
| 5,996,880 A | * | 12/1999 | Chu et al. | 228/180.21 |
| 6,295,593 B1 | * | 9/2001 | Hsu et al. | 711/169 |
| 6,298,413 B1 | * | 10/2001 | Christenson | 711/106 |
| 6,470,417 B1 | * | 10/2002 | Kolor et al. | 711/105 |
| 6,552,382 B1 | * | 4/2003 | Wu | 257/305 |

* cited by examiner

Primary Examiner—Jeffrey Gaffin
Assistant Examiner—Rijue Mai
(74) Attorney, Agent, or Firm—Bacon & Thomas, PLLC

(57) ABSTRACT

A computer system for multi-type DRAM support includes a first slot for receiving a first type DRAM, a second slot for receiving a second type DRAM, a north bridge chip, and a control circuit. The first slot includes a plurality of first slot pins, and each of them corresponds to a first pin assignment. The second slot includes a plurality of second slot pins, and each of them corresponds to a second pin assignment. The north bridge chip includes a plurality of chip pins, and each of them corresponds to a first and second pin assignment. When the control circuit generates a first control signal, the pin assignments of the chip pins are defined as the first pin assignments. When the control circuit generates a second control signal, the pin assignments of the chip pins are defined as the second pin assignments.

14 Claims, 7 Drawing Sheets

| DATA PIN ASSIGNMENT GROUP ||
|---|---|
| DDR DIMM | SDR DIMM |
| MD [0:63]<br>DM [0:7]<br>DQS [0:7] | MD [0:63]<br>DM [0:7] |

| ADDRESS PIN ASSIGNMENT GROUP ||
|---|---|
| DDR DIMM | SDR DIMM |
| A [0:12]<br>BA [0:1]<br>SCASJ<br>SRASJ<br>SWEAJ | A [0:12]<br>BA [0:1]<br>SCASJ<br>SRASJ<br>SWEAJ |

| INSTRUCTION PIN ASSIGNMENT GROUP ||
|---|---|
| DDR DIMM | SDR DIMM |
| CS [0:5]<br>CKE [0:5] | CS [0:5]<br>CKE [0:5] |

FIG. 3

| NORTH BRIDGE CHIP PIN | SDR DIMM | DDR DIMM | NORTH BRIDGE CHIP PIN | SDR DIMM | DDR DIMM | NORTH BRIDGE CHIP PIN | SDR DIMM | DDR DIMM |
|---|---|---|---|---|---|---|---|---|
| Y24 | CKE5 | CKE3 | AD3 | MD0 | MD59 | AF4 | MD2 | DM7 |
| Y25 | CKE3 | CKE2 | AD4 | MD33 | MD62 | AF5 | MD35 | MD56 |
| AA8 | CSJ5 | CSJ4 | AD5 | MD34 | MD57 | AF6 | MD5 | MD55 |
| AA10 | SCASJ | SWEAJ | AD7 | MD37 | MD50 | AF8 | MD39 | MD52 |
| AA11 | MA0 | SRASJ | AD8 | MD38 | DM6 | AF9 | MD9 | MD47 |
| AA16 | MA7 | A3 | AD10 | MD41 | MD46 | AF10 | MD42 | MD42 |
| AA17 | MA10 | A5 | AD11 | MD11 | DM5 | AF11 | MD43 | MD41 |
| AA18 | MA9 | A7 | AD13 | MD45 | MD35 | AF12 | MD13 | MD40 |
| AA19 | MA11 | A9 | AD14 | MD15 | DM4 | AF13 | MD46 | MD38 |
| AA23 | MD62 | MD5 | AD16 | DM5 | MD32 | AF15 | DM1 | MD36 |
| AA25 | MD31 | MD4 | AD17 | DM3 | MD30 | AF16 | DM6 | MD27 |
| AA26 | MD63 | MD0 | AD19 | MD49 | MD28 | AF17 | MD16 | DM3 |
| AB7 | CSJ4 | CSJ5 | AD22 | MD53 | MD17 | AF18 | MD17 | MD25 |
| AB10 | SRASJ | SCASJ | AD23 | MD56 | MD14 | AF19 | MD50 | MD23 |
| AB11 | MA1 | BA0 | AD26 | MD59 | MD3 | AF20 | MD20 | MD18 |
| AB12 | MA2 | BA1 | AE3 | MD32 | MD63 | AF22 | MD54 | MD20 |
| AB14 | MA5 | A0 | AE5 | MD3 | MD61 | AF23 | MD24 | MD15 |
| AB15 | MA3 | A1 | AE6 | MD36 | MD51 | AF24 | MD57 | MD13 |
| AB16 | MA8 | A2 | AE7 | MD6 | MD54 | AF25 | MD26 | MD9 |
| AB17 | BA0 | A4 | AE8 | MD7 | MD53 | | | |
| AB18 | BA1 | A8 | AE9 | MD40 | MD48 | | | |
| AB19 | MA12 | A11 | AE10 | MD10 | MD43 | | | |
| AB22 | CKE2 | CKE5 | AE13 | MD14 | MD39 | | | |
| AB24 | MD61 | DM0 | AE14 | MD47 | MD34 | | | |
| AB26 | MD30 | MD1 | AE15 | DM4 | MD33 | | | |
| AC6 | MD4 | MD60 | AE16 | DM2 | MD31 | | | |
| AC9 | MD8 | MD49 | AE17 | DM7 | MD26 | | | |
| AC12 | MD12 | MD45 | AE18 | MD48 | MD29 | | | |
| AC14 | MA4 | A10 | AE19 | MD18 | MD24 | | | |
| AC15 | DM0 | MD37 | AE20 | MD51 | MD22 | | | |
| AC20 | SWEAJ | A12 | AE22 | MD22 | MD16 | | | |
| AC21 | MD52 | DM2 | AE23 | MD55 | MD10 | | | |
| AC23 | MD23 | MD11 | AE24 | MD25 | DM1 | | | |
| AC24 | MD28 | MD7 | AE25 | MD58 | MD12 | | | |
| AC25 | MD60 | MD6 | AE26 | MD27 | MD8 | | | |
| AC26 | MD29 | MD2 | AF3 | MD1 | MD58 | | | |

FIG. 5

COMPUTER SYSTEM FOR MULTI-TYPE DRAM SUPPORT

REFERENCE TO RELATED APPLICATIONS

This application claims the benefit of priority under 35 U.S.C. § 119 (a) of Taiwan Patent Application No. 089 126153, filed December 2000.

BACKGROUND OF THE INVENTION

1. Field of the Invention

The invention relates generally to a computer system for multi-type DRAM support, in particular to a computer system that supports DDRAM (Dual Data Random Access Memory) and SDRAM (Synchronous Dynamic Random Access Memory).

2. Description of the Related Art

DDRAM coupled with 184 pin dual in line memory module (DIMM) slot is expected to be one of the mainstream of dynamic random access memory (DRAM). However, a change of the memory module specification is occurring. DDRAM, inserted in a 184 pin DIMM slot, is gradually taking up the market that is formerly occupied by the SDRAM, inserted in a 168 pin DIMM slot.

Due to the difference of the pin assignment between 184 pin DIMM and 168 pin DIMM, a prior art computer system cannot support both DDRAM with 184 pin DIMM and SDRAM with 168 pin DIMM at one time. During the market shifting from one specification to the other, such problem can cause troubles for users regarding computer system upgrading and purchase decision of computer system.

SUMMARY OF THE INVENTION

It is therefore a primary objective of the present invention to provide a computer system, which supports both DDRAM and SDRAM, to solve the above-mentioned problems.

In a preferred embodiment, the present invention provides a computer system for multi-type DRAM support includes a first slot for receiving a first type DRAM, a second slot for receiving a second type DRAM, a north bridge chip, and a control circuit. The first slot includes a plurality of first slot pins, and each of them corresponds to a first pin assignment. The second slot includes a plurality of second slot pins, and each of them corresponds to a second pin assignment. The north bridge chip includes a plurality of chip pins, and each of them corresponds to a first and second pin assignment. When the control circuit generates a first control signal, the pin assignments of the chip pins are defined as the first pin assignments. When the control circuit generates a second control signal, the pin assignments of the chip pins are defined as the second pin assignments.

It is an advantage of the present invention that, the computer system according the present invention comprises a 184 pin DIMM slot and a 168 pin DIMM slot, each with various pin assignments. The chip pins of the north bridge chip 16 separately correspond to the pin assignments of the 184 pin DIMM and of the 168 pin DIMM. Such allows a computer system with support for both DDRAM and SDRAM. During the transition from SDRAM to DDRAM, the users have not to worry about computer system upgrading and purchase decision of computer system.

These and other objectives of the present invention will no doubt become obvious to those of ordinary skill in the art after having read the following detailed description of the preferred embodiment, which is illustrated in the various figures and drawings.

BRIEF DESCRIPTION OF DRAWINGS

The following detailed description, given by way of an example and not intended to limit the invention to the embodiments described herein, will best be understood in conjunction with the accompanying drawings, in which:

FIG. 3 is a table of pin assignment groups according to the preferred embodiment of the invention;

FIG. 5 is a list of pin assignments of the chip pins on the north bridge chip according to the preferred embodiment of the invention;

DETAILED DESCRIPTION OF THE INVENTION

Figure 1:
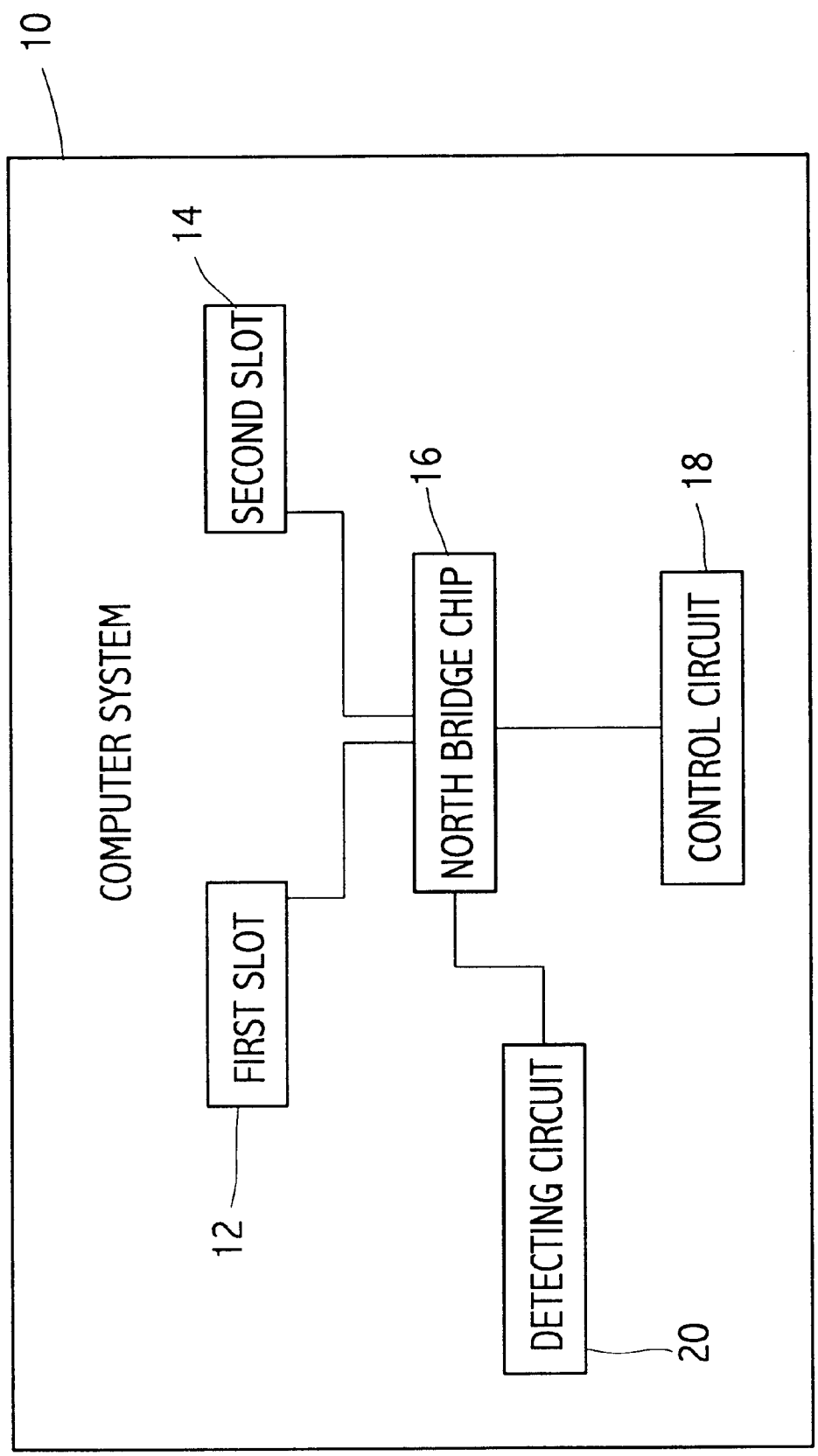
FIG. 1 is a perspective view of a computer system according to the preferred embodiment of the invention.

FIG. 1 is a perspective view of a computer system 10 according to the preferred embodiment of the invention. The computer system 10 supports two types of DRAM, wherein the first type DRAM is DDRAM and the second type DRAM is SDRAM. The computer system 10 comprises a first slot 12, a second slot 14, a north bridge chip 16, a control circuit 18, and a detecting circuit 20.

Figure 2:
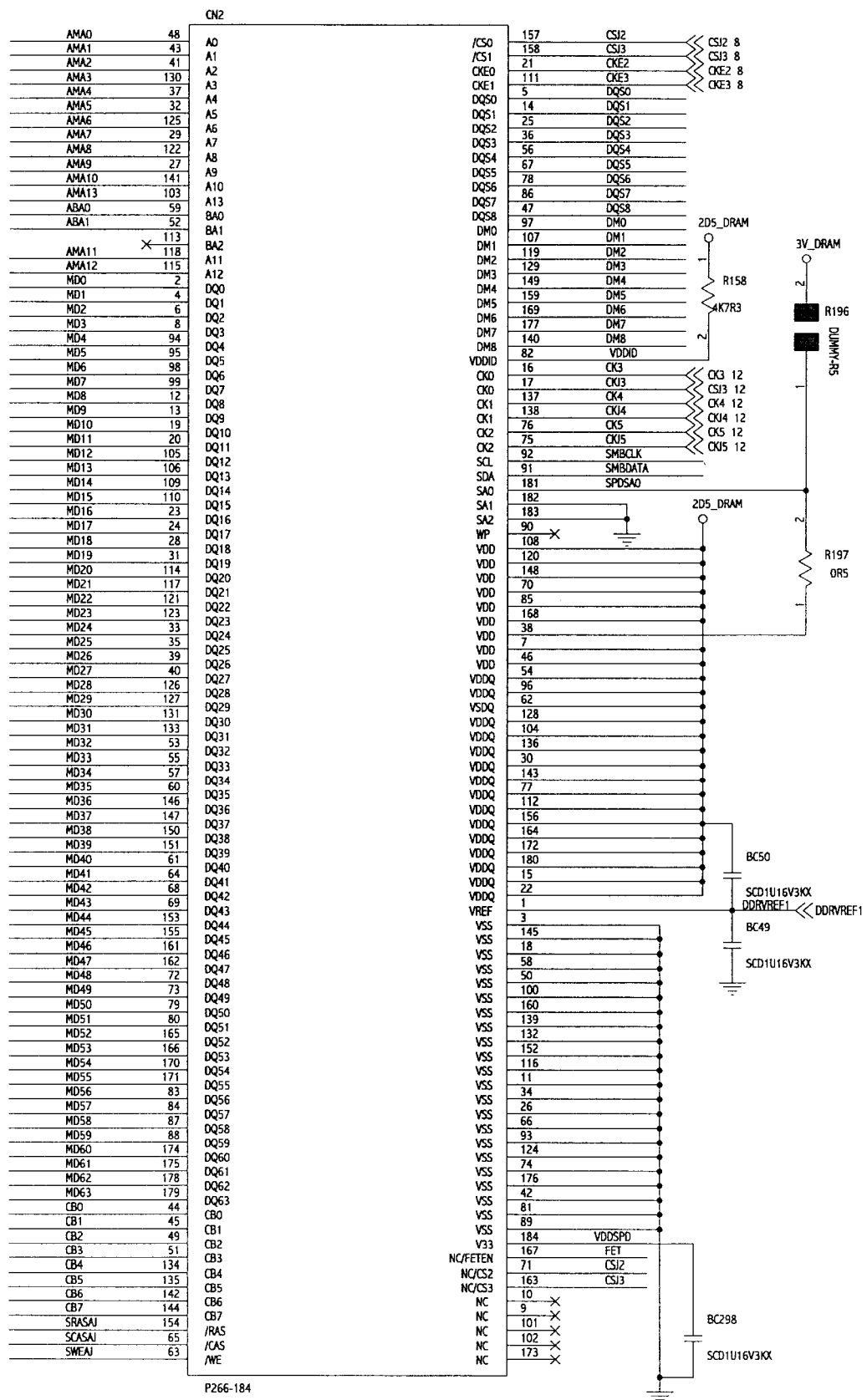
FIG. 2 is a perspective view of a first slot according to the preferred embodiment of the invention.

FIG. 2 is a perspective view of the first slot 12. The first slot 12is a 184 pin DIMM (dual in line memory module) slot for receiving DDRAM. The first slot 12 comprises a plurality of slot pins and each slot pin corresponds to a first pin assignment.

FIG. 3 is a table of pin assignment groups. The first pin assignments corresponding to the pins of the first slot 12 for connecting to the north bridge chip 16 are categorized under pin assignment groups as follows: data pin assignment group, address pin assignment group, and instruction pin assignment group. For example, a pin assignment MD [0:63] is categorized under the data pin assignment group.

Figure 4:
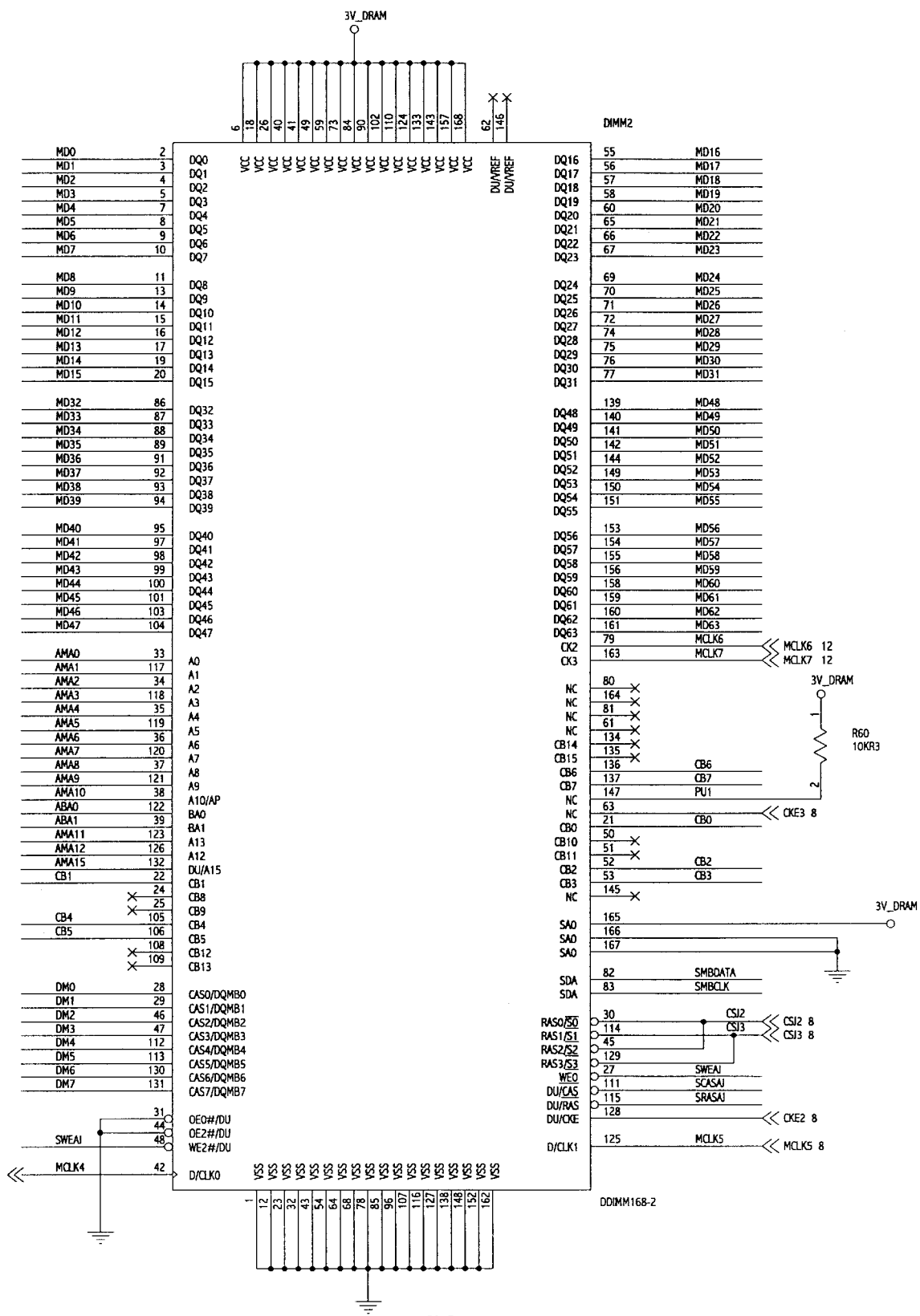
FIG. 4 is a perspective view of a second slot according to the preferred embodiment of the invention.

FIG. 4 is a perspective view of the second slot 14. The second slot 14 is a 168 pin DIMM slot for receiving SDRAM. The second slot 14 comprises a plurality of slot pins, and each slot pin corresponds to a second pin assignment.

As shown in FIG. 3, The second pin assignments corresponding to the pins of the second slot 14 for connecting to the north bridge chip 16 are categorized under pin assignment groups as follows: data pin assignment group, address pin assignment group, and instruction pin assignment group. For example, a pin assignment MD [0:63] is categorized under the data pin assignment group.

The north bridge chip 16 is connected to the first slot 12 and the second slot 14. FIG. 5 is a list of pin assignments of the chip pins of the north bridge chip 16. The north bridge chip comprises a plurality of chip pins used for connecting to the first slot 12 and the second slot 14 to control the memory. Each chip pin corresponds to a first pin assignment and a second pin assignment. The first pin assignment and the second pin assignment corresponding to the same chip pin are categorized under the same pin assignment group. For example, pin Y24 corresponds to the first pin assignment CKE (J)5 and the second pin assignment CKE (J)3. Pin assignment CKE (J)5 and CKE (J)3 are both categorized under instruction pin assignment group.

Referring to FIG. 1, the detecting circuit 20 is connected to the control circuit 18. When the detecting circuit 20 detects that a DDRAM is inserted onto the first slot 12, the detecting circuit 20 transfers a first detecting signal to the control circuit 18. Consequentially, the control circuit 18 input a first control signal to the north bridge chip 16 and the pin assignment of the chip pin of the north bridge chip 16 is defined as the first pin assignment so as to enable a data transfer between the north bridge chip 16 and the DDRAM.

When the detecting circuit 20 detects a SDRAM is inserted onto the second slot 14, the detecting circuit 20 transfers a second detecting signal to the control circuit 18. It follows that the control circuit 18 then input a second control signal to the north bridge chip 16. Consequentially, the pin assignment of the chip pin of the north bridge chip 16 is defined as the second pin assignment so as to enable a data transfer between the north bridge chip 16 and the SDRAM.

For example, the control circuit 18 can also use other pins (non chip pins) of the north bridge chip 16 such as AD18 (not shown in the diagrams), for defining the pin assignment of the chip pins on the north bridge chip 16 i.e. those listed in the FIG. 5. When the pin AD18 is at high voltage, the pin assignment of the chip pins on the north bridge chip 16 is defined as the first pin assignment for supporting DDRAM. On the other hand, when the pin AD18 is at low voltage, the pin assignment of the chip pins on the north bridge chip 16 is defined as the second pin assignment for supporting SDRAM.

In the embodiment according to the invention, the north bridge chip is aimed to support two memory modules. A great deal of effort is put into the placement and layout of the components and pins on the motherboard. Traditionally, engineers often defines functions of a chip, the number of pins and pin placements before proceeding to circuit and motherboard layout. Due to the fact that the pin placement is determined, it often occurred that engineer has to arrange through holes, circuit layers crossing and moat regions crossing of the motherboard during layout. Noises and interferences of signal transfer arise as a result.

In the past when computer did not operate in a high-frequency environment, the adverse effect is tolerable. However, modern high-frequency computer has become mainstream, modifications of the pin placement are constantly required by buyers to address the noises and interferences. This inevitably creates both time and financial loss for manufacturers.

To overcome the problem arising from earlier determined pin placement, engineers firstly can compare the difference on the slot pin configuration between the first slot and the second slot and then determine the placement of the first slot and the second slot. For example, when the first slot is arranged in an upright orientation and the second slot is arranged in a reversed orientation in relation to the orientation of the first slot, the pin configuration of two creates a certain corresponding relationship and similarity. Based on such results, a list of pin assignments of the chip pins on the north bridge chip is determined as shown in the FIG. 5.

Figure 6:
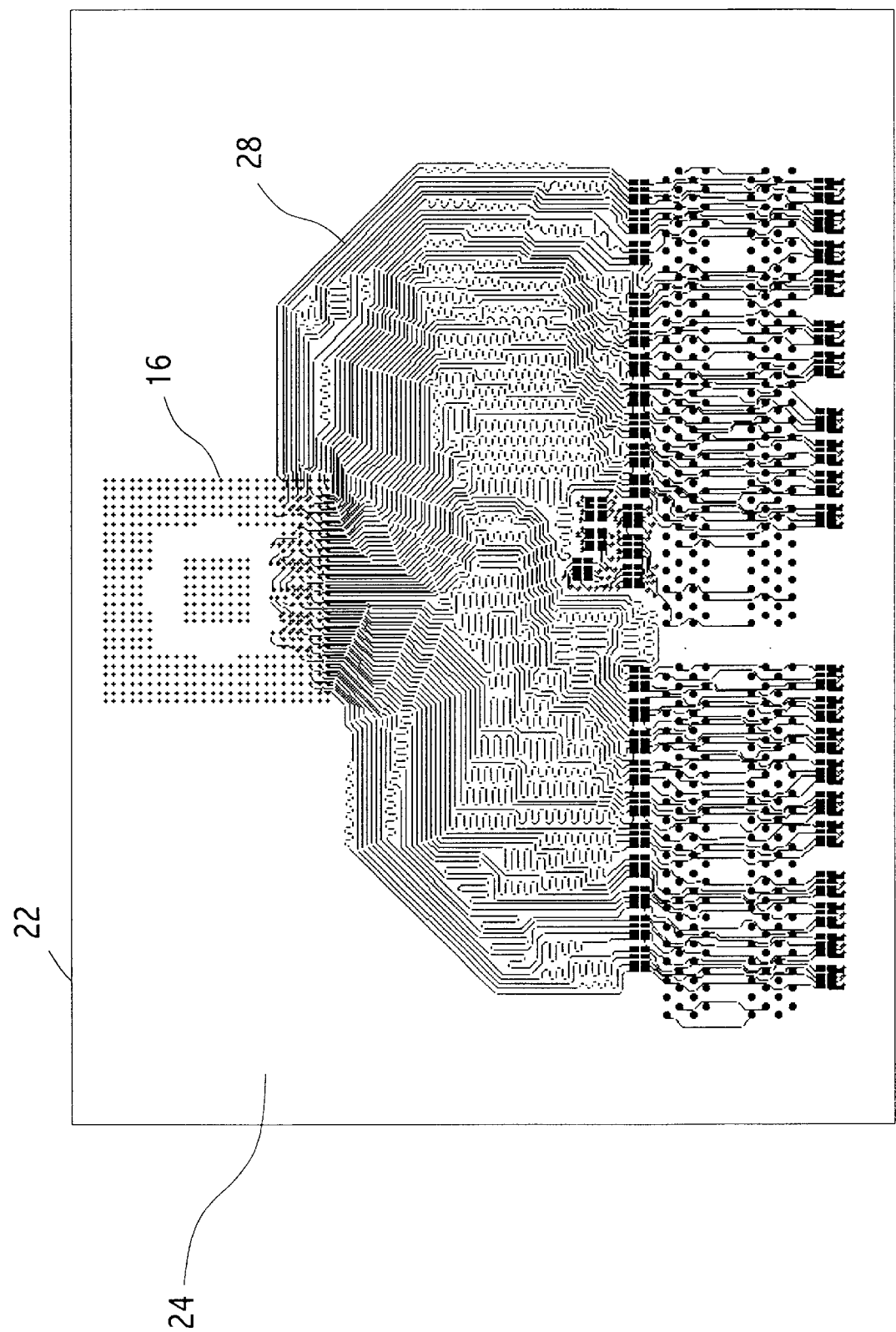
FIG. 6 is a perspective view of the first surface of the motherboard in the computer system according to the preferred embodiment of the invention.
Figure 7:
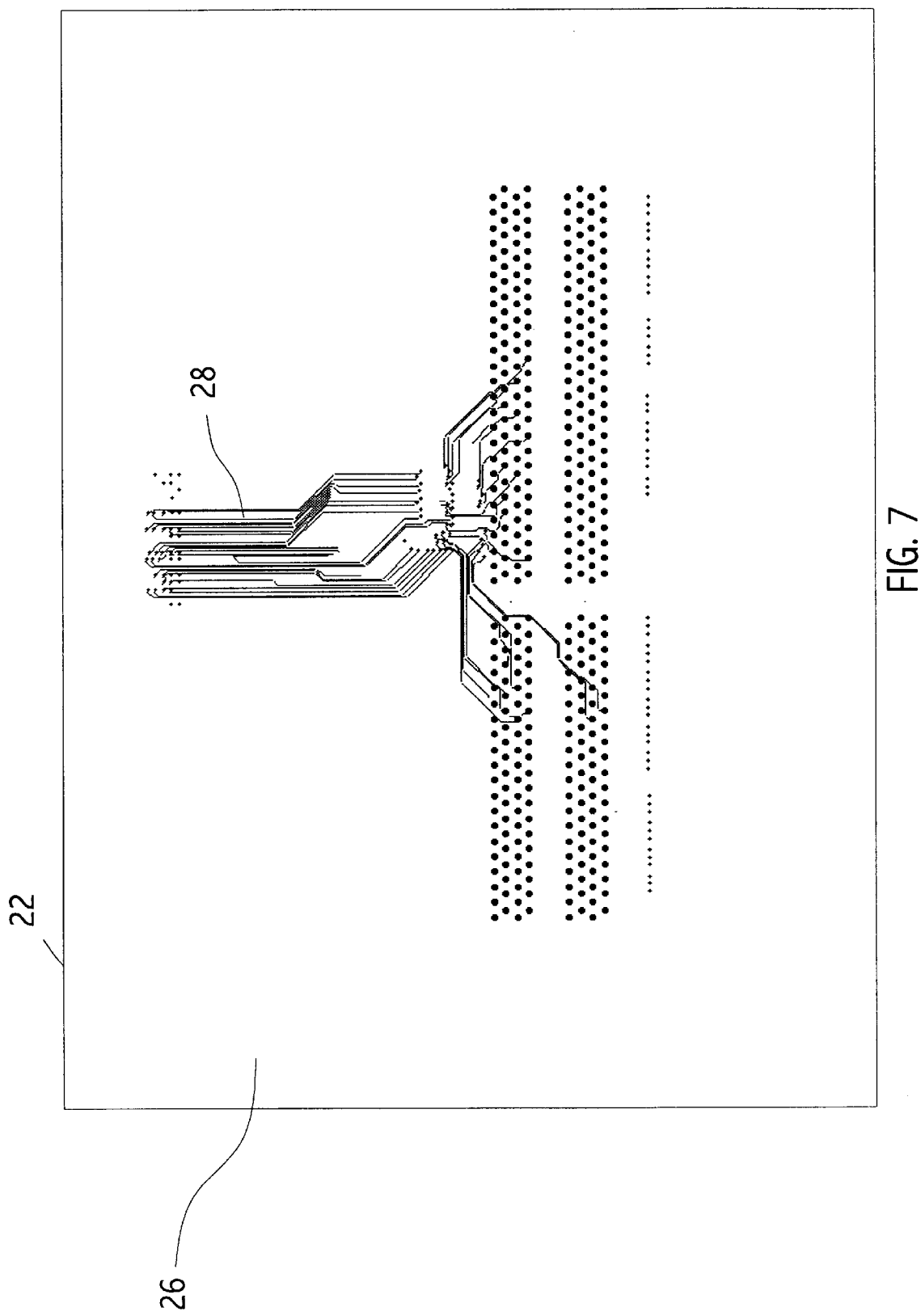
FIG. 7 is a perspective view of the second surface of the motherboard in the computer system according to the preferred embodiment of the invention.

FIG. 6 is a perspective view of the first surface 24 of the motherboard 22 in the computer system 10. FIG. 7 is a perspective view of the second surface 26 of the motherboard 22 in the computer system 10. The computer system 10 further comprises a motherboard 22, wherein first slot 12, second slot 14, north bridge chip 16, control circuit 18 and a detecting circuit 20 are mounted on the first surface 24 of the motherboard 22. The pins on the north bridge chip that are used for memory control are connected to the first slot 12 and the second slot 14 via conducting route 28 on the motherboard 22.

In order to maintain signal integrity by applying minimal through holes and optimized routing in the motherboard layout, the pin assignments are categorized under three groups. They are data pin assignment group, address pin assignment group, and instruction pin assignment group as shown in the FIG. 3.

When the pin assignments of pins are under the same pin assignment group, the pins generate similar signals. Referring to FIG. 3, pin assignments MD [0:63] for DDR DIMM slot and pin assignments DM [0:7] for SDR DIMM slot are under the same pin assignment group—the data pin assignment group. For example, a DDR pin with pin assignment MD63 and a SDR pin with pin assignment MD32 are both in the data pin assignment group and generate similar signals. Another example is a SDR pin with pin assignment DM0 and a DDR pin with pin assignment MD37 both are also in the data pin assignment group and generate similar signals.

Furthermore, the pin assignments of the pins can switch without eliminating the routing performance. Referring to FIG. 3, A[0:12], BA[0:1], SCASJ, SRASJ and SWEAJ are categorized under the address pin assignment group. As a result, pins with the pin assignments can switch without reducing the routing performance.

For example, a DDR pin with pin assignment A3 and a SDR pin with pin assignment A7 are both in the address pin assignment group. Accordingly the pin assignment of the corresponding pin can switch from pin assignment A3 for DDR slot to pin assignment A7 for SDR slot.

In another example is, a SDR pin with pin assignment SCASJ and a DDR pin with pin assignment SWEAJ are both in the address pin assignment group. Accordingly the pin assignment of the corresponding pin can switch from pin assignment SCASJ for SDR slot to pin assignment SWEAJ for DDR slot.

The other example is when a DDR pin with pin assignment falling in the pin assignment range CS[0:5] and a SDR pin with pin assignment falling in the pin assignment range CKE[0:5]. Since the pin assignment range CS[0:5] and the pin assignment range CKE[0:5] are both categorized under the instruction pin assignment group, the pin assignment of said SDR pin and DDR pin can swab without reducing the routing performance.

As shown in the FIG. 6 and FIG. 7, pins on the north bridge chip 16, corresponding to the data pin assignment group, are connected to the first slot 12 and the second slot 14 via conducting route 28 on the first surface 24 of the motherboard 22. Pins on the north bridge chip 16, corresponding to the address pin assignment group and the instruction pin assignment group, are connected to the first slot 12 and the second slot 14 via conducting route 28 on the second surface 26 of the motherboard 22.

In order to avoid noises and adverse effect caused by through holes, circuit layers crossing and moat regions crossing, on the circuit layout, the routes of three outer pin of the chip are arranged on the component side of a motherboard.

In addition, due to the fact that DRAM signal operates in a high frequency condition, 80 chip pins under the data pin assignment group, including MD[0:63], DM[0:7], and DQS [0:7], are arranged in the first three rows so as to place on the component side of a motherboard. Pins under the address pin assignment group and instruction pin assignment group, including A[0:12], BA[0:1], SCASJ, SRASJ, SWEAJ, CS[0:5], and CKE[0:5], are arranged in the last three rows so as to place on the solder side of a motherboard.

However, it has to be taken into account that the layout area on the component side may not be large enough for arranging routes assigned for 80 pins. In real practice, engineers divide those routes for 80 pins into 8 groups. For example, MD[0:7], DM[0], DQS[0] are categorized under group 0; and MD[8:15], DM[1], DQS[1] are categorized under group 1 accordingly.

Moreover, engineers arrange each group having the same number of through holes and layer crossing so as to minimize the layout area and unify the signal characteristics of each group. That means the interferences can be controlled under tolerable scale and the adverse effect caused can be lessened.

In other words, the data pin assignment group are further divided into 8 data pin assignment sub group to allow pins on the north bridge chip 16 corresponding to each data pin assignment sub group shares similar signal characteristics and thus eliminate the adverse effect caused thereby.

Compare with prior art, the computer system 10 according the present invention comprises a 184 pin DIMM slot and a 168 pin DIMM slot, each with various pin assignments. The chip pins of the north bridge chip 16 separately correspond to the pin assignments of the 184 pin DIMM and of the 168 pin DIMM. Such allows a computer system with support for both DDRAM and SDRAM. During the transition from SDRAM to DDRAM, the users have not to worry about computer system upgrading and purchase decision of computer system.

While the invention has been described with reference to various illustrative embodiments, the description herein should not be construed in a limiting sense. Various modifications of the illustrative embodiments, as well as other embodiments of the invention, will be apparent to those skilled in the art upon reference to this description. It is therefore contemplated that the appended claims will cover any such modifications or embodiments as may fall within the scope of the invention defined by the following claims and their equivalents.

What is claimed is:

1. A computer system with first type DRAM and second type DRAM support comprising:
   a motherboard having a first surface and a second surface;
   a first slot, mounted on the first surface of the motherboard, used for receiving the first type DRAM, the first slot having a plurality of first slot pins, each first slot pin corresponding to a first pin assignment;
   a second slot, mounted in the first surface of the motherboard, used for receiving the second type DRAM, the second slot having a plurality of second slot pins, each second slot pin corresponding to a second pin assignment;
   a plurality of conducting routes;
   a north bridge chip, mounted in the first surface of the motherboard, having a plurality of chip pins, connected to the first slot and the second slot through the conducting routes, each chip pin corresponding to the first pin assignment and the second pin assignment; and
   a control circuit, mounted in the first surface of the motherboard, connected to the north bridge chip, used for determining the pin assignment of the chip pins;
   wherein, when the control circuit inputs a first control signal to the north bridge chip, the pin assignment of the chip pins is defined as the first pin assignment so as to enable a data transfer between the north bridge chip and the first type DRAM, and when the control circuit inputs a second control signal to the north bridge chip, the pin assignment of the chip pins is defined as the second pin assignment, so as to enable a data transfer between the north bridge chip and the second type DRAM.

2. The computer system of claim 1, wherein the first type DRAM is DDRAM (dual data random access memory), and the second type DRAM is SDRAM (synchronous dynamic random access memory).

3. The computer system of claim 2, wherein the first slot is a 184 pin DIMM (dual in line memory module) slot, and the second slot is a 168 pin DIMM slot.

4. The computer system of claim 1, wherein the first pin assignments corresponding to the first slot pin are categorized under a plurality of pin assignment groups, the second pin assignments corresponding to the second slot pin are categorized under a plurality of pin assignment groups, and a first pin assignment and a second pin assignment corresponding to the same chip pin are categorized under the same pin assignment group.

5. The computer system of claim 4, wherein the pin assignment groups comprises a data pin assignment group, an address pin assignment group, and an instruction pin assignment group.

6. The computer system of claim 5, wherein the chip pins of the north bridge chip corresponding to the data pin assignment group are connected to the first slot and the second slot through the conducting routes on the first surface of the motherboard, and the chip pins of the north bridge chip corresponding to the address pin assignment group and the instruction pin assignment group are connected to the first slot and the second slot through conducting routes on the second surface of the motherboard.

7. The computer system of claim 5, wherein the data pin assignment group is further divided into eight data pin assignment sub groups, the chip pins of the north bridge chip corresponding to the same data pin assignment sub group share identical signal characteristics.

8. The computer system of claim 1 further comprising a detecting circuit connected to the control circuit, wherein when the detecting circuit detects the first type DRAM is inserted in the first slot, the detecting circuit transfers a first detecting signal to the control circuit, the control circuit transfers the first control signal to the north bridge chip to set the pin assignments of the chip pins as the first pin assignments, when the detecting circuit detects the second type DRAM is inserted in the second slot, the detecting circuit transfers a second detecting signal to the control circuit, the control circuit transfers the second control signal to the north bridge chip to set the pin assignments of the chip pins as the second pin assignments.

9. A computer system with DDRAM and SDRAM support comprising:
   a motherboard having a first surface and a second surface;
   a first slot, mounted on the first surface of the motherboard, used for receiving the DDRAM, the first slot having a plurality of first slot pins, each first slot pin corresponding to a first pin assignment, wherein the first pin assignments are categorized under a plurality of pin assignment groups;

a second slot, mounted on the first surface of the motherboard, used for receiving the SDRAM, the second slot having a plurality of second slot pins, each second slot pin corresponding to a second pin assignment, wherein the second pin assignments are categorized under said plurality of pin assignment groups;

a plurality of conducting routes;

a north bridge chip having a plurality of chip pins, mounted on the first surface of the motherboard, connected to the first slot and the second slot through the conducting routes, each chip pin corresponding to a first pin assignment and a second pin assignment, wherein the first pin assignment and the second pin assignment are categorized under the same pin assignment group; and a control circuit, mounted on the first surface of the motherboard, connected to the north bridge chip, used for defining the pin assignments of the chip pins;

wherein, when the control circuit inputs a first control signal to the north bridge chip, the pin assignments of the chip pins are set as the first pin assignments so as to enable a data transfer between the north bridge chip and the DDRAM, and when the control circuit inputs a second control signal to the north bridge chip, the pin assignments of the chip pins are set as the second pin assignments, so as to enable a data transfer between the north bridge chip and the SDRAM.

10. The computer system of claim 9, wherein the first slot is a 184 pin DIMM slot, and the second slot is a 168 pin DIMM slot.

11. The computer system of claim 9, wherein the pin assignment groups comprises a data pin assignment group, an address pin assignment group, and an instruction pin assignment group.

12. The computer system of claim 9, a detecting circuit connected to the control circuit, wherein when the detecting circuit detects the DDRAM is inserted in the first slot, the detecting circuit transfers a first detecting signal to the control circuit, the control circuit transfers the first control signal to the north bridge chip to set the pin assignments of the chip pins as the first pin assignments, when the detecting circuit detects the SDRAM is inserted in the second slot, the detecting circuit transfers a second detecting signal to the control circuit, the control circuit transfers the second control signal to the north bridge chip to set the pin assignments of the chip pins as the second pin assignments.

13. The computer system of claim 11, wherein the chip pins of the north bridge chip corresponding to the data pin assignment group are connected to the first slot and the second slot through the conducting routes on the first surface of the motherboard, and the chip pins of the north bridge chip corresponding to the address pin assignment group and the instruction pin assignment group are connected to the first slot and the second slot through the conducting routes on the second surface of the motherboard.

14. The computer system of claim 11, wherein the data pin assignment group is further divided into eight data pin assignment sub groups, the pins of the north bridge chip corresponding to the same data pin assignment sub group share identical signal characteristics.

* * * * *